(12) United States Patent
Bae

(10) Patent No.: US 10,586,704 B2
(45) Date of Patent: Mar. 10, 2020

(54) WAFER PROCESSING METHOD

(71) Applicant: DISCO CORPORATION, Tokyo (JP)

(72) Inventor: Taewoo Bae, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 15/824,365

(22) Filed: Nov. 28, 2017

(65) Prior Publication Data

US 2018/0151370 A1    May 31, 2018

(30) Foreign Application Priority Data

Nov. 29, 2016 (JP) ................... 2016-230792

(51) Int. Cl.
| | |
|---|---|
| *H01L 21/268* | (2006.01) |
| *B23K 26/53* | (2014.01) |
| *B23K 26/00* | (2014.01) |
| *H01L 21/683* | (2006.01) |
| *H01L 23/544* | (2006.01) |
| *H01L 23/00* | (2006.01) |
| *B23K 101/40* | (2006.01) |
| *B23K 103/00* | (2006.01) |

(52) U.S. Cl.
CPC ........ *H01L 21/268* (2013.01); *B23K 26/0006* (2013.01); *B23K 26/53* (2015.10); *H01L 21/6836* (2013.01); *H01L 23/544* (2013.01); *H01L 23/562* (2013.01); *B23K 2101/40* (2018.08); *B23K 2103/56* (2018.08); *H01L 2221/6834* (2013.01); *H01L 2221/68327* (2013.01); *H01L 2223/5446* (2013.01)

(58) Field of Classification Search
None
See application file for complete search history.

(56) References Cited

U.S. PATENT DOCUMENTS

| | | | |
|---|---|---|---|
| 2007/0117352 A1* | 5/2007 | Lee ......................... | B28D 5/00 438/460 |
| 2008/0035611 A1* | 2/2008 | Kuno ................. | B23K 26/0057 219/69.1 |

FOREIGN PATENT DOCUMENTS

| | | |
|---|---|---|
| JP | 2002-192370 | 7/2002 |
| JP | 2004-111428 | 4/2004 |

* cited by examiner

*Primary Examiner* — Bradley Smith
(74) *Attorney, Agent, or Firm* — Greer Burns & Crain, Ltd.

(57) ABSTRACT

A processing method for a wafer having a plurality of streets inclined at 45° relative to a cleavage direction including a laser processing step of positioning a focusing point of a laser beam with a wavelength as to be transmitted through the wafer in the inside of the wafer, and applying the laser beam along the streets to form a plurality of modified layers, overlapping with one another in the wafer thickness direction, inside the wafer along each of the streets. In the laser processing step, m modified layers (m is a natural number not less than $n \cdot \sqrt{2}$) are formed overlapping with one another in the wafer thickness direction, where n (n is a natural number) is the number of modified layers needing to be formed overlapping with one another in a wafer thickness direction when dividing a wafer having a plurality of streets parallel to a cleavage direction.

4 Claims, 4 Drawing Sheets

WAFER PROCESSING METHOD

BACKGROUND OF THE INVENTION

Field of the Invention

The present invention relates to a wafer processing method in which the inside of a wafer is modified by a laser beam.

Description of the Related Art

In electronic apparatuses such as mobile phones and personal computers, a device chip provided with a device such as an electronic circuit is an indispensable component. The device chip is produced, for example, by partitioning a front surface of a wafer formed of a semiconductor material such as silicon with a plurality of streets (division lines) into a plurality of regions, forming devices in the regions, and dividing the wafer along the streets.

As one of methods for dividing a wafer, there has been known a method called SD or stealth dicing in which a laser beam capable of being transmitted through a wafer is focused on a position inside the wafer, to form a region modified through multiphoton absorption (such a region will hereinafter be referred to as modified layer) (see, for example, Japanese Patent Laid-Open No. 2002-192370). After the modified layer is formed along each of the streets, a force is applied to the wafer, whereby the wafer can be divided, with the modified layer as a starting point of division.

Meanwhile, in the SD, the modified layer is liable to be left in the device chips, so that the die strength often cannot be enhanced sufficiently. In view of this, a method called SDBG or stealth dicing before grinding has also been put to practical use, in which the formation of the modified layer is followed by grinding the back side of the wafer, to thereby dividing the wafer into a plurality of device chips while removing the modified layer (see, for example, Japanese Patent Laid-Open No. 2004-111428).

SUMMARY OF THE INVENTION

In the aforementioned SDBG, for promotion of division into the device chips, it is a general practice to set the streets along cleavage directions corresponding to a plurality of cleavage planes perpendicular to the major surface of the wafer. Note that the layout of transistors constituting the devices is also determined in conformity to the directions of the streets.

On the other hand, in recent years, there has been investigated a method of increasing a driving current of positive metal oxide semiconductor (pMOS) transistors by forming devices in a condition where a wafer has been rotated 45° from the existing general disposition. In this method, however, the directions of the streets are also inclined at 45° from cleavage directions, so that it may be impossible to suitably divide the wafer even when the modified layer is formed under the existing general conditions.

Accordingly, it is an object of the present invention to provide a wafer processing method for processing a wafer having a plurality of streets inclined at 45° relative to a cleavage direction in such a manner that the wafer can be suitably divided.

In accordance with an aspect of the present invention, there is provided a method of processing a wafer having a plurality of streets inclined at 45° relative to a cleavage direction, the method including a laser processing step of positioning a focusing point of a laser beam having such a wavelength as to be transmitted through the wafer in the inside of the wafer, and applying the laser beam along the streets to form a plurality of modified layers, overlapping with one another in a wafer thickness direction, inside the wafer along each of the streets, and a dividing step of dividing the wafer along the modified layers into a plurality of chips after the laser processing step, wherein in the laser processing step, m modified layers (m is a natural number of not less than $n\cdot\sqrt{2}$) are formed overlapping with one another in the wafer thickness direction, where n (n is a natural number) is the number of modified layers needing to be formed overlapping with one another in a wafer thickness direction when dividing a wafer having a plurality of streets parallel to a cleavage direction.

In the aforementioned aspect of the present invention, the wafer may be a silicon wafer having a (100) plane as a major surface.

In the wafer processing method according to the one aspect of the present invention, m modified layers (m is a natural number of not less than $n\cdot\sqrt{2}$) are formed, where n (n is a natural number) is the number of modified layers needed when dividing a wafer having a plurality of streets parallel to a cleavage direction, and, therefore, a wafer having a plurality of streets inclined at 45° relative to a cleavage direction can be suitably divided.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Referring to the attached drawings, an embodiment according to one mode of the present invention will be described. A wafer processing method according to this embodiment includes a laser processing step (see FIGS. 2A, 2B and 3A) and a dividing step (see FIG. 3B). In the laser processing step, a laser beam having such a wavelength as to be transmitted through the wafer is applied to a wafer having a plurality of streets (division lines) inclined at 45° relative to a cleavage direction, to form inside the wafer a plurality of modified layers overlapping with one another in the wafer thickness direction. Note that in the laser processing step, m modified layers (m is a natural number of not less than $n\cdot\sqrt{2}$) are formed, where n (n is a natural number) is the number of modified layers needing to be formed when dividing a wafer having streets parallel to a cleavage direction. In the dividing step, the back side of the wafer is ground to thin the wafer, and the wafer is divided, with the modified layers as starting points of division, into a plurality of chips. The wafer processing method according to this embodiment will be described in detail below.

Figure 1A:
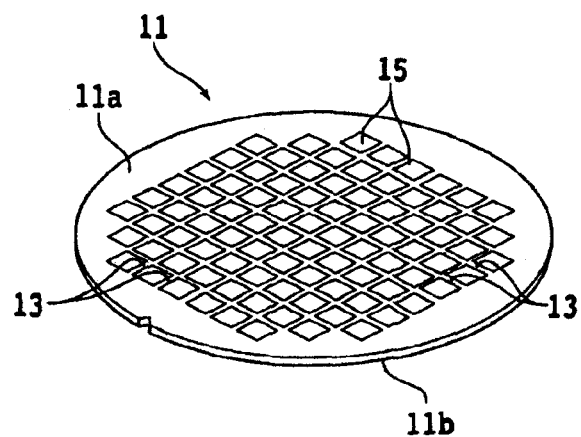
FIG. 1A is a perspective view depicting schematically a configuration example of a wafer.

FIG. 1A is a perspective view depicting schematically a configuration example of the wafer to be processed by the wafer processing method according to this embodiment. The wafer 11 to be processed in this embodiment is, for example, a silicon wafer formed in a circular disk shape from crystalline silicon, and has a front surface (major surface) 11a and a back surface (major surface) 11b each constituted of a (100) plane. The wafer 11 is cleaved, for example, along cleavage directions D1 and D2 (FIG. 1C) corresponding to a plurality of cleavage planes perpendicular to the front surface 11a (or the back surface 11b) of the wafer 11 (the cleavage directions D1 and D2 are parallel to the front surface 11a (or the back surface 11b) and are perpendicular to each other). Note that the cleavage planes are, for example, {110} planes perpendicular to the front surface 11a (or the back surface 11b), and the cleavage directions D1 and D2 (FIG. 1C) are parallel to the cleavage planes.

The front surface 11a side of the wafer 11 is partitioned into a plurality of regions by streets (division lines) 13 arranged in a grid pattern, and a device 15 such as integrated circuit (IC) or large-scale integration (LSI) is formed in each of the regions. The streets 13 are set in a direction inclined at 45° relative to the cleavage directions D1 and D2 of the wafer 11. Note that while the circular disk-shaped silicon wafer including crystalline silicon is used as the wafer 11 in this embodiment, there is no restriction on the material, shape, structure, size or the like of the wafer 11. For example, a wafer 11 including other crystalline material can also be used. Similarly, there is no restriction on the kind, number, size, layout or the like of the devices 15.

Figure 1B:
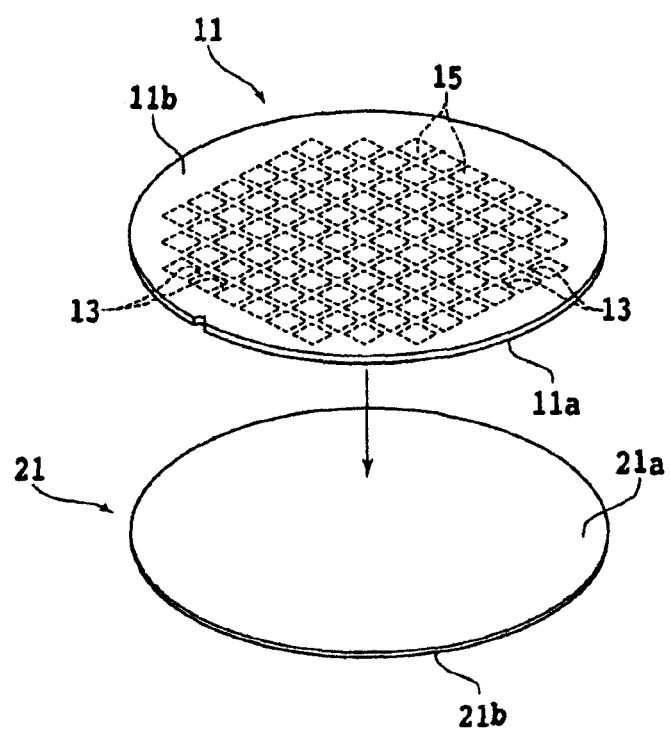
FIG. 1B is a perspective view depicting schematically the manner in which a protective member is adhered to the wafer.
Figure 1C:
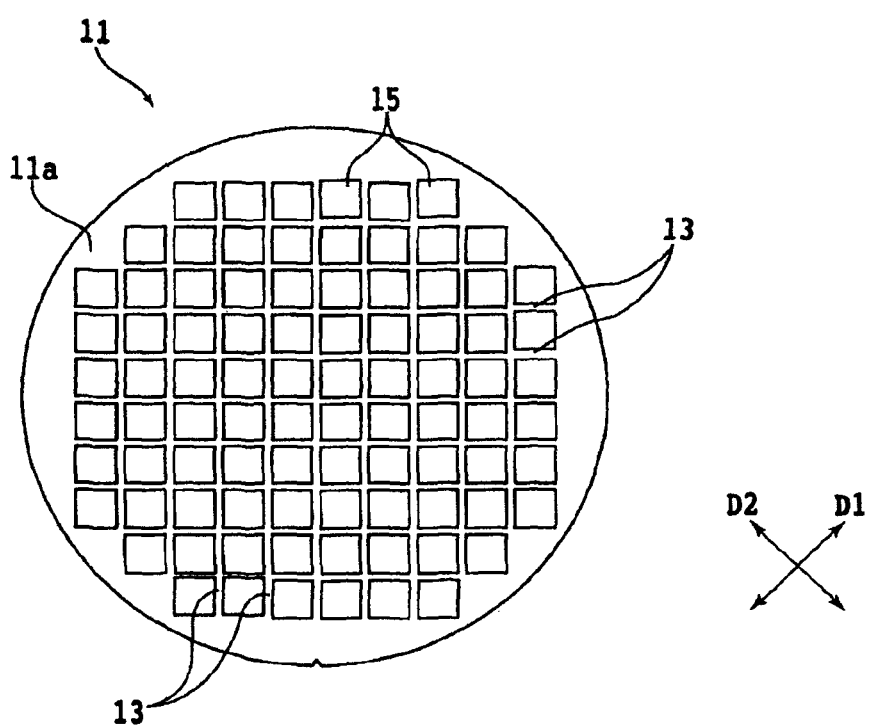
FIG. 1C is a plan view of the depicting schematically a front surface of the wafer.

It is recommendable to adhere a protective member to the front surface 11a side of the above-mentioned wafer 11, before carrying out the wafer processing method according to this embodiment. FIG. 1B is a perspective view depicting schematically the manner in which the protective member is adhered to the wafer 11. The protective member 21 is, for example, a circular film (tape) having a diameter comparable to that of the wafer 11, and a glue layer having a sticking force is provided on the front surface 21a side thereof. Therefore, when the front surface 21a side of the protective member 21 is put into close contact with the front surface 11a side of the wafer 11, the protective member 21 can be adhered to the front surface 11a side of the wafer 11. With the protective member 21 adhered to the front surface 11a side of the wafer 11, a shock exerted in each of the subsequent steps can be absorbed, and breakage of the devices 15 and the like can be prevented.

Figure 2A:
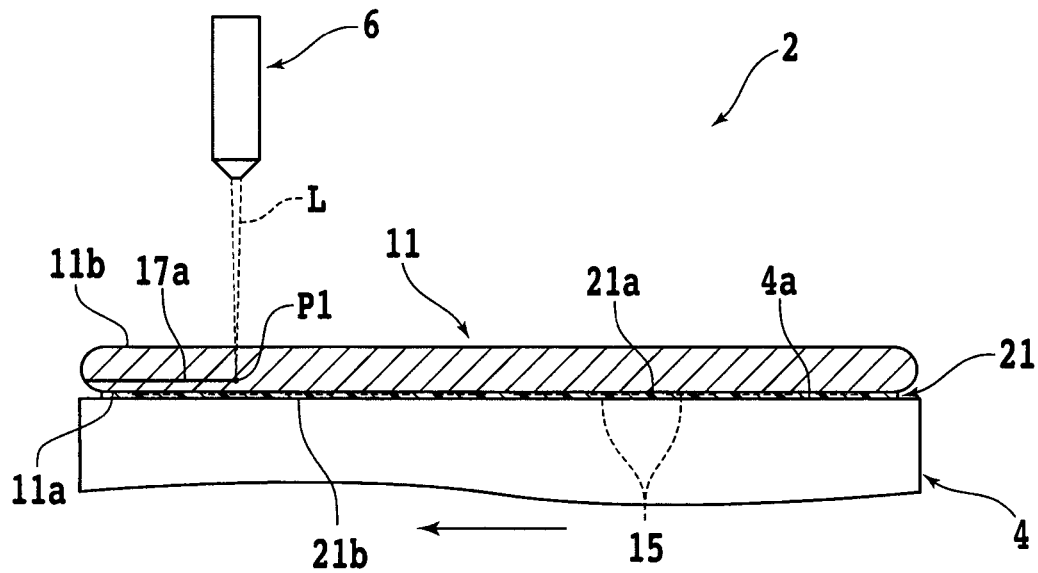
FIGS. 2A and 2B are partly sectional side views depicting schematically a laser processing step.
Figure 2B:
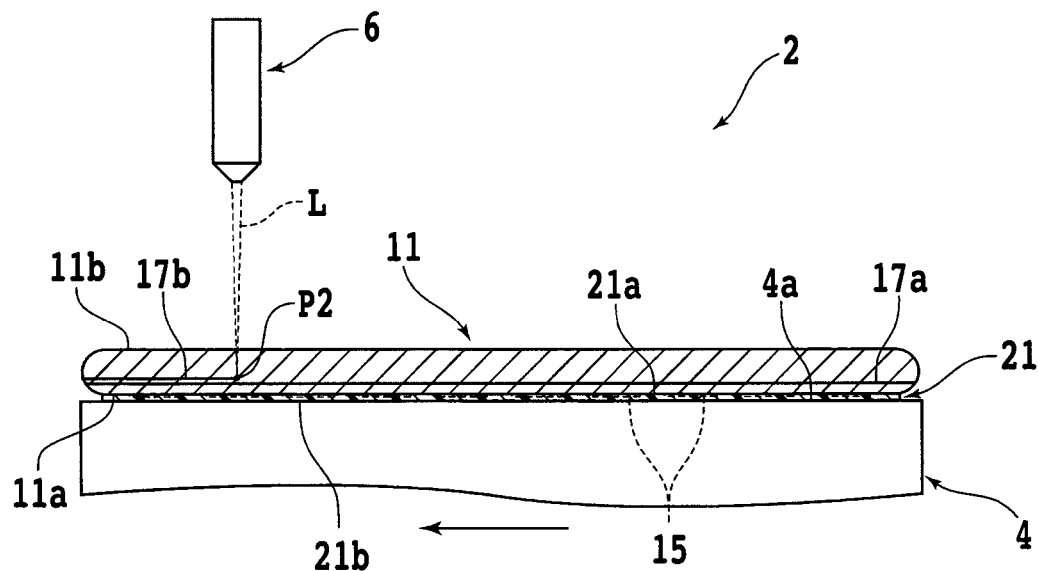

After the protective member 21 is adhered to the front surface 11a side of the wafer 11, a laser processing step for forming modified layers inside the wafer 11 is conducted. FIGS. 2A and 2B are partly sectional side views depicting schematically a laser processing step. As depicted in FIGS. 2A and 2B, a laser processing apparatus 2 used in this embodiment is provided with a chuck table 4 for holding the wafer 11 by suction.

The chuck table 4 is connected to a rotational drive source (not depicted) such as a motor, and is rotated about a rotational axis substantially parallel to the vertical direction. In addition, a moving mechanism (not depicted) is provided under the chuck table 4, and the chuck table 4 is moved in horizontal directions by the moving mechanism. Part of an upper surface of the chuck table 4 is a holding surface 4a for holding the front surface 11a side of the wafer 11 (the back surface 21b side of the protective member 21) by suction. The holding surface 4a is connected to a suction source (not depicted) through a suction passage (not depicted) formed inside the chuck table 4 and the like. With a negative pressure of the suction source made to act at the holding surface 4a, the wafer 11 is held onto the chuck table 4 by suction.

A laser irradiation unit 6 is disposed on an upper side of the chuck table 4. The laser irradiation unit 6 applies and focuses a laser beam L oscillated on a pulse basis by a laser oscillator (not depicted) to an arbitrary position. The laser oscillator is configured in such a manner that a laser beam L having such a wavelength as to be transmitted through (be difficulty absorbed in) the wafer 11 can be oscillated on a pulse basis.

In the laser processing step, first, the back surface 21b of the protective member 21 adhered to the wafer 11 is brought into contact with the holding surface 4a of the chuck table 4, and a negative pressure of the suction source is made to act thereon. As a result, the wafer 11 is suction held on the chuck table 4, with the back surface 11b side exposed to the upper side. Next, the chuck table 4 is moved and rotated in such a manner that the laser irradiation unit 6 is aligned to an extension line of the division line 13 as an object of processing. Then, as depicted in FIG. 2A, while applying a laser beam L from the laser irradiation unit 6 toward the back surface 11b of the wafer 11, the chuck table 4 is moved in a direction parallel to the division line 13 as the object of processing.

Note that here, the laser beam L is focused on a first depth position P1 inside the wafer 11. In other words, the focusing point of the laser beam L is matched to the first depth position P1 inside the wafer 11. This ensures that the inside of the wafer 11 can be modified at the first depth position P1 to form there a first modified layer 17a to be a starting point of division. The first modified layer 17a is desirably formed at such a depth position that it is removed by later grinding. In other words, it is sufficient that the first depth position P1 is set at such a depth position that the first modified layer 17a formed there is removed by later grinding. For example, in the case where the wafer 11 is to be ground later from the back surface 11b side to be thinned to a thickness of approximately 30 μm, the first modified layer 17a is formed while setting the position of depth (distance) of approximately 70 μm from the back surface 11a as the first depth position P1. The aforementioned operation is repeated to form the first modified layer 17a along each of all the division lines 13, after which another modified layer is formed by the same method at a different depth position. Here, as depicted in FIG. 2B, the laser beam L is focused on a second depth position P2 inside the wafer 11. In other words, the focusing point of the laser beam L is matched to the second depth position P2 inside the wafer 11. This ensures that the inside of the wafer 11 can be modified at the second depth position P2 to form there a second modified layer 17b to be a starting point of division. The second modified layer 17b also is formed along each of all the division lines 13. By these operations, two modified layers (the first modified layer 17a and the second modified layer 17b) overlapping with each other in the thickness direction of the wafer 11 can be formed. When a number of modified layers needed for dividing the wafer 11 have been formed overlapping with each other in the wafer thickness direction, the laser processing step is finished. Note that in the case of forming three or more modified layers overlapping with one another in the wafer thickness direction, it is sufficient to repeat the aforementioned operation by further changing the depth on which the laser beam L is focused.

Figure 3A:
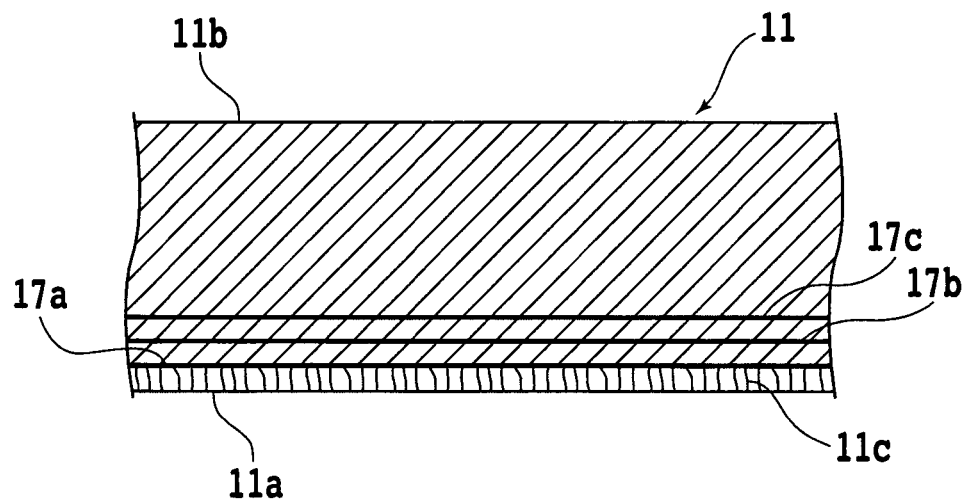
FIG. 3A is a sectional view depicting schematically the state of the wafer after the laser processing step.

FIG. 3A is a sectional view depicting schematically the state of the wafer 11 after the laser processing step. Note that FIG. 3A depicts a state in which a third modified layer 17c overlapping with the first modified layer 17a and the second modified layer 17b has been formed. The aforementioned number of modified layers needed for dividing the wafer 11 is calculated based on the number of modified layers needed when dividing an ordinary wafer having a plurality of streets parallel to a cleavage direction. Specifically, assuming that the number of modified layers to be formed overlapping with one another in a wafer thickness direction when dividing the above-mentioned ordinary wafer is n (n is a natural number), the number of modified layers necessary for dividing the wafer 11 in this embodiment is m (m is a natural number of not less than n·√2). Thus, in the laser processing step in this embodiment, m modified layers are formed overlapping with one another in the thickness direction of the wafer 11.

For example, it is assumed that one modified layer is necessary for dividing a wafer which is configured in the same manner as the wafer 11 in this embodiment except that it has streets parallel to a cleavage direction. In this case, since the minimum natural number of not less than 1·√2 (≈1.4) is 2, it is understood that it is sufficient to form not less than two modified layers for suitably dividing the wafer 11 in this embodiment. Similarly, it is assumed that two modified layers are needed for dividing a wafer which is configured in the same way as the wafer 11 in this embodiment except that it has streets parallel to a cleavage direction. In this case, since the minimum natural number of not less than 2·√2 (≈2.8) is 3, it is seen that it is sufficient to form not less than three modified layers for suitably dividing the wafer 11 in this embodiment.

To be more specific, for example, in the case where conditions in forming modified layers in a wafer having streets parallel to a cleavage direction are as follows, the number of modified layers necessary for suitably dividing this wafer is 2 (n=2).

Material of wafer: silicon (crystal)
Thickness of wafer: 100 to 700 μm
Wavelength of laser beam: 1064 nm or 1342 nm
Output of laser beam: 1 to 1.5 W
Repetition frequency of laser beam: 90 to 100 kHz
Spot diameter of laser beam: 1 to 2.5 μm
Moving speed (feed rate) of chuck table: 100 to 800 mm/s Therefore, where modified layers are to be formed under the same conditions in the wafer 11 in this embodiment in which the direction of the streets 13 is inclined at 45° from the cleavage directions D1 and D2 (FIG. 1C), the number of the modified layers needed is three or more. It should be noted that these conditions are merely an example, and are not limitative of the present invention.

Note that if the position of the first modified layer 17a is too close to the front surface 11a of the wafer 11, a phenomenon called splash in which the devices 15 are damaged due to refraction, reflection, scattering or the like of the laser beam L is liable to be generated. For restraining the generation of the splash, it is sufficient, for example, to form the first modified layer 17a at a depth (distance) of not less than 60 μm from the front surface 11a. On the other hand, if the position of the first modified layer 17a is far from the front surface 11a, cracks 11c extending from the first modified layer 17a to reach the front surface 11a would not be generated, so that it would be impossible to suitably divide the wafer 11. When the second modified layer 17b (or the third modified layer 17c) overlapping with the first modified layer 17a is formed, as in this embodiment, the generation of the second modified layer 17b (or the third modified layer 17c) induces easy generation of cracks 11c extending from the first modified layer 17a to reach the front surface 11a. The splash is liable to occur also in the case where the position of the second modified layer 17b (or the third modified layer 17c) is near the first modified layer 17a. Therefore, it is recommendable to form the second modified layer 17b (or the third modified layer 17c) at a position separate from the first modified layer 17a. For example, where the first modified layer 17a is formed at a depth position of approximately 70 μm from the front surface 11a, it is recommendable to form the second modified layer 17b at a depth position spaced further by approximately 70 μm from the first modified layer 17a, and to form the third modified layer 17c at a depth position spaced further by approximately 70 μm from the second modified layer 17b.

Figure 3B:
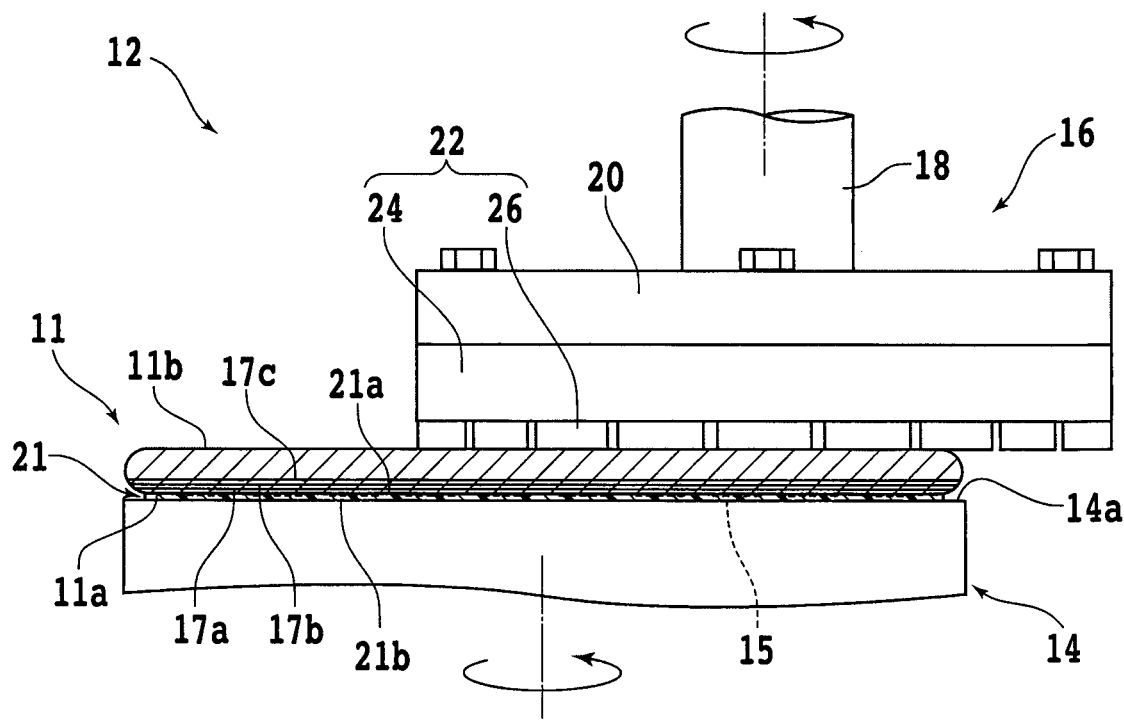
FIG. 3B is a partly sectional side view depicting schematically a dividing step.

After the laser processing step, a dividing step of dividing the wafer 11, with the modified layers 17a, 17b and 17c as starting points of division, into a plurality of chips while thinning the wafer 11 by grinding the back surface 11b is performed. FIG. 3B is a partly sectional side view depicting schematically the dividing step. The dividing step is conducted, for example, by use of a grinding apparatus 12 depicted in FIG. 3B. The grinding apparatus 12 is provided with a chuck table 14 for holding the wafer 11 by suction. The chuck table 14 is connected to a rotational drive source (not depicted) such as a motor, and is rotated about a rotational axis substantially parallel to the vertical direction. In addition, a moving mechanism (not depicted) is provided under the chuck table 14, and the chuck table 14 is moved in horizontal directions by the moving mechanism. Part of an upper surface of the chuck table 14 is a holding surface 14a for suction holding the protective member 21 adhered to the wafer 11. The holding surface 14a is connected to a suction source (not depicted) through a suction passage (not depicted) formed inside the chuck table 14 and the like. A negative pressure of the suction source is made to act at the holding surface 14a, whereby the wafer 11 is held onto the chuck table 14 through the protective member 21.

A grinding unit 16 is disposed on an upper side of the chuck table 14. The grinding unit 16 is provided with a spindle housing (not depicted) supported by a lifting mechanism (not depicted). A spindle 18 is accommodated in the spindle housing, and a circular disk-shaped mount 20 is fixed to a lower end portion of the spindle 18 that is exposed from a lower surface of the spindle housing. A grinding wheel 22 substantially the same in diameter as the mount 20 is mounted to a lower surface of the mount 20. The grinding wheel 22 is provided with a wheel base 24 formed from a metallic material such as stainless steel or aluminum. A plurality of grindstones 26 are arranged in an annular pattern on a lower surface of the wheel base 24. A rotational drive source (not depicted) such as a motor is connected to an upper end side (base end side) of the spindle 18, and the grinding wheel 22 is rotated about a rotational axis substantially parallel to the vertical direction, by a force generated by the rotational drive source. A nozzle (not depicted) for supplying a grinding liquid such as pure water to the wafer 11 and the like is provided inside or in the vicinity of the grinding unit 16.

In the dividing step, first, the wafer 11 carried from the chuck table 4 of the laser processing apparatus 2 is suction held onto the chuck table 14 of the grinding apparatus 12. Specifically, the back surface 21b of the protective member 21 adhered to the wafer 11 is brought into contact with the holding surface 14a of the chuck table 14, and a negative pressure of the suction source is made to act thereon. As a result, the wafer 11 is held on the chuck table 14, with the back surface 11b side exposed to the upper side. Next, the chuck table 14 is moved to a lower side of the grinding unit 16. Then, as depicted in FIG. 3B, the chuck table 14 and the grinding wheel 22 are each rotated, and the spindle housing (the spindle 18 and the grinding wheel 22) is lowered while supplying the grinding liquid to the back surface 11b of the wafer 11 and the like.

The lowering speed (lowering amount) of the spindle housing is adjusted to such a level that the lower surfaces of the grindstones 26 are pressed against the back surface 11b side of the wafer 11. This ensures that the back surface 11b side can be ground, thereby thinning the wafer 11. When the wafer 11 has been thinned to a predetermined thickness (finished thickness) and been divided into a plurality of chips, for example with the first modified layer 17a, the second modified layer 17b and the third modified layer 17c as starting points of division, the dividing step is finished. Note that while the back surface 11b side of the wafer 11 is ground by use of one set of grinding unit 16 (grindstones 26) in this embodiment, the wafer 11 may be ground by use of two or more sets of grinding units (grindstones). For example, rough grinding may be conducted using grindstones including large-diameter abrasive grains and finish grinding may be conducted using grindstones including small-diameter abrasive grains, whereby flatness of the back surface 11b can be enhanced without much prolonging the time required for grinding.

As has been described above, in the wafer processing method according to this embodiment, m modified layers (m is a natural number of not less than n·√2) are formed, where n (n is a natural number) is the number of modified layers needed when dividing a wafer having a plurality of streets parallel to a cleavage direction, and, therefore, a wafer 11 having a plurality of streets 13 inclined at 45° relative to cleavage directions D1 and D2 (FIG. 1C) can be divided suitably.

Note that the present invention can be carried out without being limited by the description of the embodiment above but while performing various modifications. For example, while the back surface lib of the wafer 11 is ground in the dividing step in the embodiment above, the wafer 11 can also be divided by a method such as expansion of an expandable tape adhered to the wafer 11, application of a pressure by use of a rod-shaped member or roller, or the like.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method of processing a wafer, the method comprising:
    providing a wafer having a plurality of streets inclined at 45° relative to a cleavage direction;
    calculating a value for "m," where "m" is a natural number of not less than n·√2, and further wherein "n" is a natural number and is the number of modified layers that would need to be formed overlapping with one another in a wafer thickness direction if dividing a wafer of the same configuration as said wafer having a plurality of streets inclined at 45° relative to a cleavage direction, except having a plurality of streets parallel to a cleavage direction;
    a laser processing step of positioning, in the inside of the wafer, a focusing point of a laser beam having such a wavelength as to be transmitted through the wafer, and applying the laser beam along the streets to form a plurality of modified layers, overlapping with one another in a wafer thickness direction, inside the wafer along each of the streets; and
    a dividing step of dividing the wafer along the modified layers into a plurality of chips after the laser processing step,
    wherein in the laser processing step, said calculated value "m" is the number of modified layers formed.

2. The method according to claim 1, wherein the wafer is a silicon wafer having a (100) plane as a major surface.

3. A method of processing a wafer, the method comprising:
    providing a wafer having a plurality of streets inclined at 45° relative to a cleavage direction;
    a laser processing step of positioning, in the inside of the wafer, a focusing point of a laser beam having such a wavelength as to be transmitted through the wafer, and applying the laser beam along the streets to form a plurality of modified layers, overlapping with one another in a wafer thickness direction, inside the wafer along each of the streets; and
    a dividing step of dividing the wafer along the modified layers into a plurality of chips after the laser processing step,
    wherein in the laser processing step, m modified layers (m is a natural number of not less than n·√2) are formed overlapping with one another in the wafer thickness direction, where n (n is a natural number) is the number of modified layers that would need to be formed overlapping with one another in a wafer thickness direction if dividing a wafer of the same configuration except having a plurality of streets parallel to a cleavage direction,
    wherein said modified layers are separated, and spaced apart, from each other, and further wherein a distance between each of said modified layers is the same.

4. A method of processing a wafer, the method comprising:
    providing a wafer having a plurality of streets inclined at 45° relative to a cleavage direction;
    a laser processing step of positioning, in the inside of the wafer, a focusing point of a laser beam having such a wavelength as to be transmitted through the wafer, and applying the laser beam along the streets to form a plurality of modified layers, overlapping with one another in a wafer thickness direction, inside the wafer along each of the streets; and
    a dividing step of dividing the wafer along the modified layers into a plurality of chips after the laser processing step,
    wherein in the laser processing step, m modified layers (m is a natural number of not less than n·√2) are formed overlapping with one another in the wafer thickness direction, where n (n is a natural number) is the number of modified layers that would need to be formed overlapping with one another in a wafer thickness direction if dividing a wafer of the same configuration except having a plurality of streets parallel to a cleavage direction,
    wherein a distance between a front surface of the wafer and a first modified layer and a distance between each modified layer is the same.

* * * * *